United States Patent
Lee

(10) Patent No.: US 6,268,625 B1
(45) Date of Patent: Jul. 31, 2001

(54) TRENCH-TYPE THIN FILM TRANSISTOR

(75) Inventor: Sang-Ho Lee, Chungcheongbuk-do (KR)

(73) Assignee: LG Semicon Co., Ltd., Chungcheongbuk Do (KR)

( * ) Notice: Subject to any disclaimer, the term of this patent is extended or adjusted under 35 U.S.C. 154(b) by 0 days.

(21) Appl. No.: 09/302,997

(22) Filed: Apr. 30, 1999

Related U.S. Application Data

(62) Division of application No. 08/974,281, filed on Nov. 19, 1997, now Pat. No. 5,937,283.

(30) Foreign Application Priority Data

Aug. 14, 1997 (KR) .................................................. 97-38882

(51) Int. Cl.[7] .................... H01L 29/96; H01L 31/062; H01L 31/113; H01L 31/119
(52) U.S. Cl. ........................ 257/331; 257/330; 257/332; 257/347; 257/352
(58) Field of Search .................... 257/329, 330, 257/331, 332, 347, 352

(56) References Cited

U.S. PATENT DOCUMENTS

| | | | |
|---|---|---|---|
| 4,683,643 | 8/1987 | Nakajima et al. | 438/270 |
| 4,845,537 | 7/1989 | Nishimura et al. | 257/302 |
| 5,084,407 | 1/1992 | Boland et al. | 438/697 |
| 5,122,848 | 6/1992 | Lee et al. | 257/265 |
| 5,229,310 | 7/1993 | Sivan | 438/157 |
| 5,270,968 | 12/1993 | Kim et al. | 438/156 |
| 5,285,093 | 2/1994 | Lage et al. | 257/332 |
| 5,298,780 | 3/1994 | Harada | 257/330 |
| 5,334,862 | 8/1994 | Manning et al. | 257/67 |
| 5,508,531 | 4/1996 | Ha | 257/57 |
| 5,804,855 | 9/1998 | Manning et al. | 257/330 |
| 5,969,378 | * 10/1999 | Singh | 257/77 |
| 6,020,600 | * 2/2000 | Miyajima et al. | 257/76 |

OTHER PUBLICATIONS

Shuji Idea et al., "A Polysilicon Transistor Technology for Large Capacity SRAMs"; International Electron Devices Meeting; Dec. 9–12, 1990; pp. 18.1.1–18.1.4.

* cited by examiner

*Primary Examiner*—Ngân V. Ngô
(74) *Attorney, Agent, or Firm*—Morgan, Lewis & Bockius LLP

(57) ABSTRACT

A thin film transistor and a method for fabricating the same in which a self alignment method is used to form an offset area and source and drain electrodes are disclosed, the TFT including a substrate; a trench formed in the substrate; an active layer formed on the substrate and on the trench; a gate insulating film formed on the active layer; a gate electrtode formed on the gate insulating film on at least one side of the trench; a source region formed in the active layer on a bottom side of the trench; and drain regions formed in the active layer on the substrate to be isolated form the gate electrode.

11 Claims, 6 Drawing Sheets

TRENCH-TYPE THIN FILM TRANSISTOR

This is a divisional of application(s) application Ser. No. 08/974.281 filed on Nov. 19, 1997, now U.S. Pat. No. 5,937,283.

BACKGROUND OF THE INVENTION

1. Field of the Invention

The present invention relates to a semiconductor device and, more particularly, to a thin film transistor and a method for fabricating the same in which a seli alignment method is used to form an offset region and source and drain electrodes.

2. Discussion of the Related Art

A thin film transistor (hereinafter referred to as a TFT) is used in an SRAM cell of over 1M class instead of a CMOS load transistor or a load resistor. It is used as a switching device that switches picture data signals in each pixel. In particular, in case of an SRAM cell in which a PMOS TFT is used as a load transistor, off-current is reduced and on-current is increased so that the power consumption is diminished and that the memory characteristics are enhanced. Thus SRAM cells with good qualities can be realized.

An offset region is an important element for stable performance of an SRAM cell. It matters how precisely an offset region is formed. That is, the less it is modified in its process, the more precisely it is formed.

A conventional TFT and a conventional method for fabricating the same will be described with reference to the accompanying drawings.

FIG. 1 is a cross-sectional view showing the structure of a conventional TFT, which includes an insulating layer 21, a gate electrode 22a formed on a predetermined area of the insulating layer 21, a gate insulating film 24 formed on the insulating film 24 including the gate electrode 22a, a drain electrode D formed on the gate insulating film 24 and spaced apart from the gate electrode 22a, a source electrode S, in opposition to the drain electrode 22a, formed on the gate insulating film 24 to overlap the gate electrode 22a, and a channel region I and an offset region II formed on the gate insulating film 24 between the source electrode S and the drain electrode D. Herein, the offset region II is placed between the drain electrode D and the gate electrode 22a.

A conventional method for fabricating the above-mentioned TFT will be described with reference to the accompanying drawings.

Referring initially to FIG. 2A, a first polysilicon layer 22 for a gate electrode of the TFT is formed on an insulating layer 21. A first photoresist film 23 is coated on the first polysilicon layer 22 and is then patterned with an exposure and development process to form a pattern for a gate electrode.

Referring to FIG. 2B, thereafter, using this pattern as a mask, the first polysilicon layer 22 is selectively removed to form a gate electrode 22a.

Referring to FIG. 2C, a gate insulating film 24, which is a silicon oxide film, is deposited on the insulating layer 21 including the gate electrode 22a. Next, a second polysilicon layer 25 is formed on the gate insulating film 24 and then a second photoresist film 26 is coated on the second polysilicon layer 25.

Referring to FIG. 2D, the second photoresist film 26 is patterned for formation of channel and offset regions so as to form a mask pattern 26a. Using the mask pattern 26a, impurity ions are implanted to form a source electrode S partially overlapping the gate electrode 22a and a drain electrode D spaced apart from the gate electrode 22a by a predetermined distance. Consequently, the overall process for fabricating the TFT is completed.

However, the conventional TFT and the conventional fabricating method thereof have the following problems. Since processes using masks are necessary in forming source and drain electrodes and channel and offset regions, the overall process becomes complicated. Further, in mask alignment, misalignment might be caused so that there is modified an offset region that is an important element for stable performance of an SRAM cell.

SUMMARY OF THE INVENTION

Therefore, the present invention is directed to a TFT and a fabricating method thereof that substantially obviates one or more of problems due to limitations and disadvantages of the related art.

An object of the invention is to provide a TFT and a method for fabricating the same in which a self-alignment method is applied using no masks in forming source and drain electrodes and offset and channel regions, so as to simplify the overall process and realize stable performance of SRAM cells.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the TFT includes a substrate; a trench formed in the substrate; an active layer formed on the substrate and on the trench; a gate insulating film formed on the active layer; a gate electrtode formed on the gate insulating film on at least one side of the trench; a source region formed in the active layer on a bottom side of the trench; and drain regions formed in the active layer on the substrate to be isolated form the gate electrode.

In another aspect of the present invention, a method for fabricating a TFT includes the steps of forming a trench having first and second sides in a substrate; forming an active layer on the substrate and on the trench; forming a gate insulating film on the active layer; forming first and second patterns of conductivity on the gate insulating film on the first and second sides of the trench and on the substrate adjoining to the first and second sides of the trench; implanting ions by using the first and second patterns as masks so as to form source and drain regions in the active layer; and removing the first and second patterns on the gate insulating film on the substrate so as to form first and second gate electrodes.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
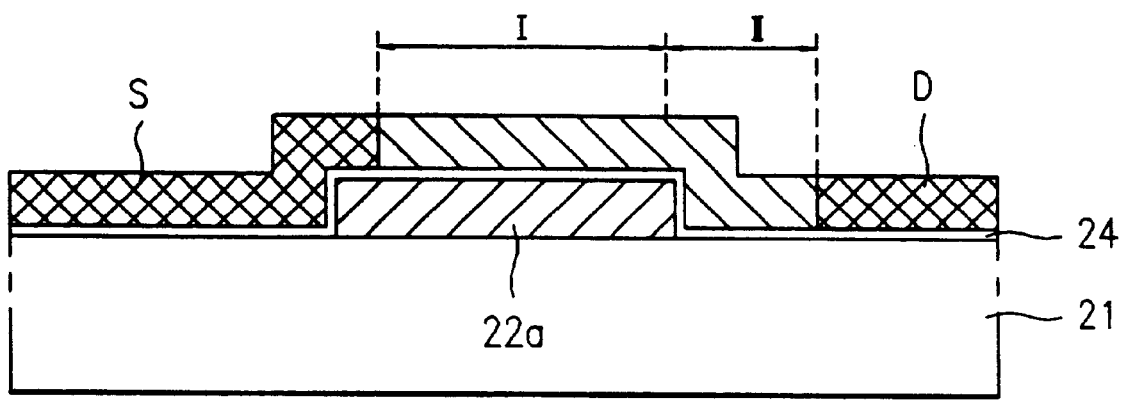
FIG. 1 is a cross-sectional view showing the structure of a conventional TFT.
Figure 2A:
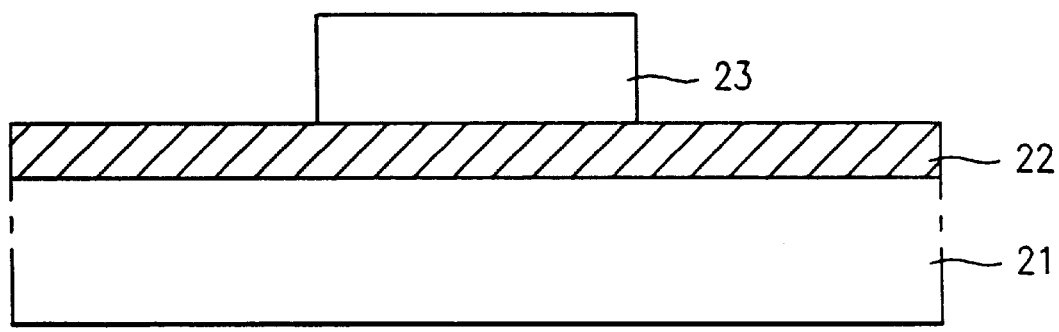
FIGS. 2A to 2D are cross-sectional views showing process steps of a conventional method for fabricating a TFT.
Figure 2B:
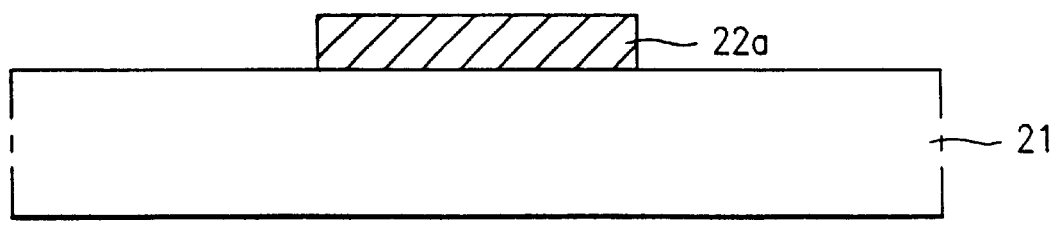
Figure 2C:
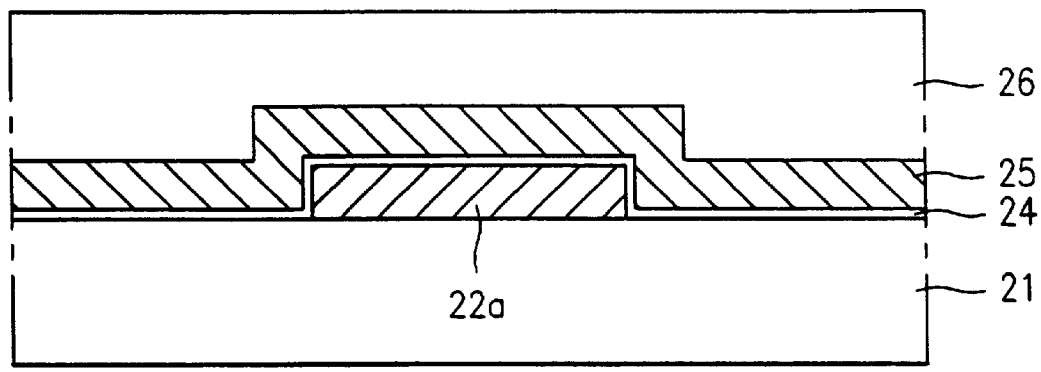
Figure 2D:
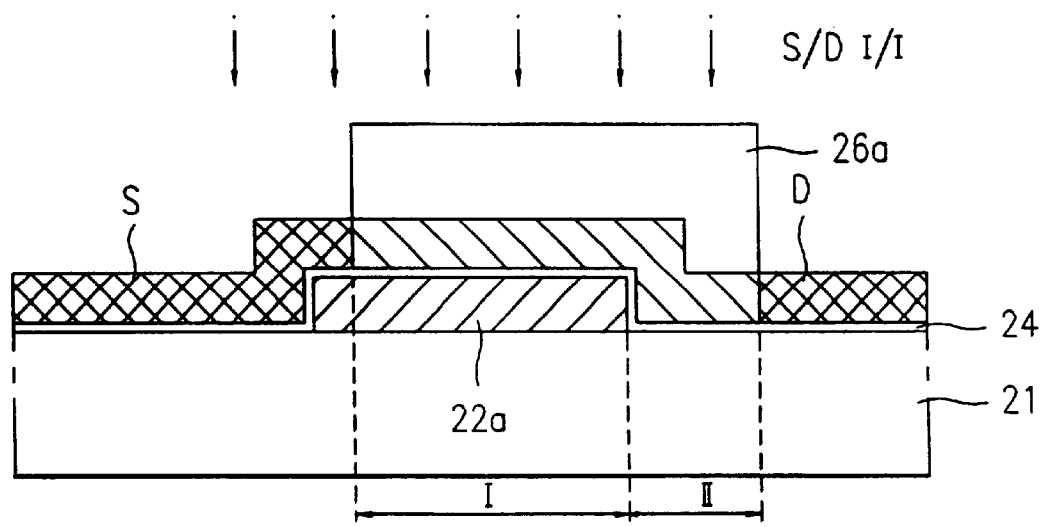
Figure 3:
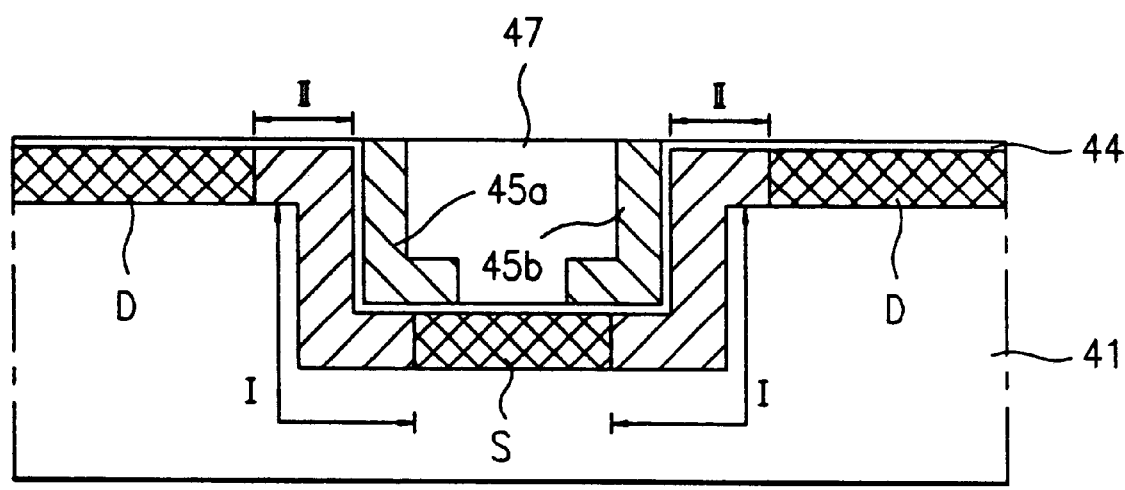
FIG. 3 is a cross-sectional view showing the structure of a TFT in accordance with the present invention.

FIG. 3 is a cross-sectional view showing the structure of a TFT of the present invention which includes a substrate 41, a trench 42 having first and second sides in the substrate 41, an active layer 43 formed on the substrate 41 and on the trench 42, a gate insulating film 44 formed on the active layer 43, first and second gate electrodes 45a and 45b formed on the gate insulating film 44 on the first and second sides of the trench 42, a source region S on a bottom side of the trench between the first and second gate electrodes 45a and 45b, and a drain region D formed in the active layer 43 on the substrate and isolated from the first and second gate electrodes 45a and 45b.

Herein, first and second offset regions II are formed in the active layer between the drain region D and the first and second gate electrodes 45a and 45b.

A method for fabricating the above-mentioned TFT will be describe below with reference to FIGS. 4A to 4F.

Figure 4A:
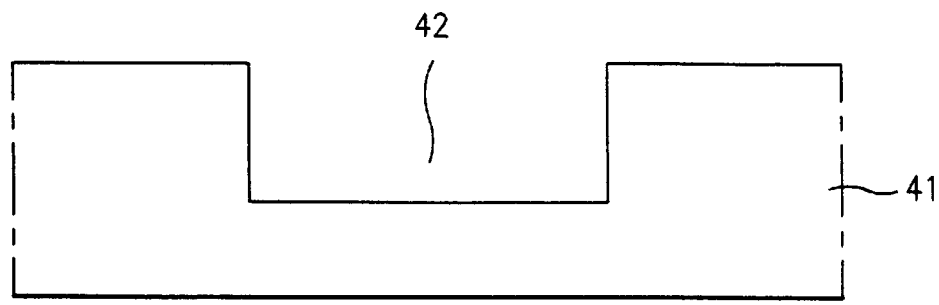
FIGS. 4A to 4F are cross-sectional views showing process steps of a method for fabricating a TFT in accordance with a preferred embodiment of the present invention.

Referring initially to FIG. 4A, a predetermined area of a substrate 41 is etched to form a trench. Herein the substrate 41 includes an insulating film or an insulating substrate.

Figure 4B:
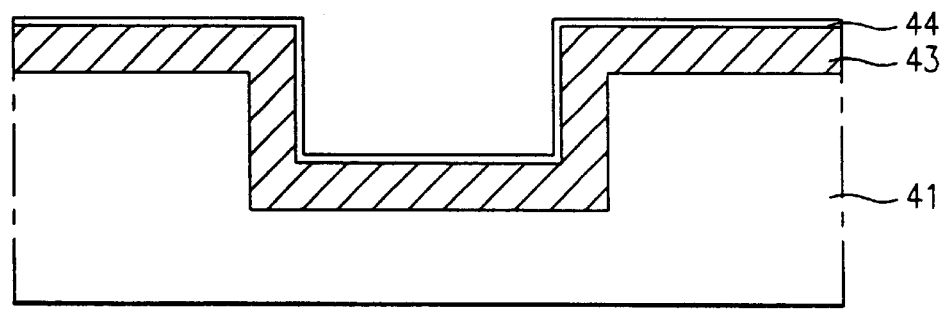

Referring to FIG. 4B, an active layer 43 is formed on the substrate 41 including the trench 42. Next, a gate insulating film 44, which is a silicon oxide film, is formed on the active layer 43, which will be used as source and drain electrodes.

Figure 4C:
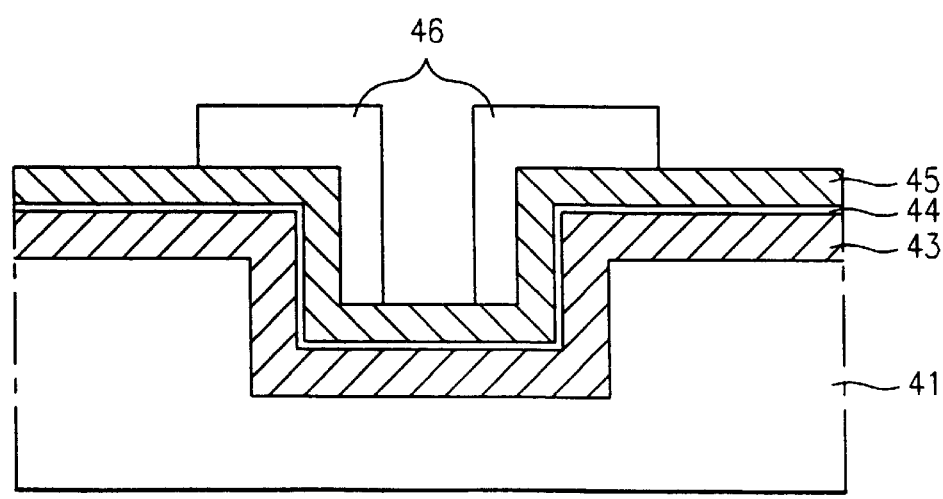

Referring to FIG. 4C, a conductive layer 45 is formed on the gate insulating film 44 and a photoresist film 46 is then coated on the entire surface. Next an exposure and development process is performed to pattern the photoresist film.

Figure 4D:
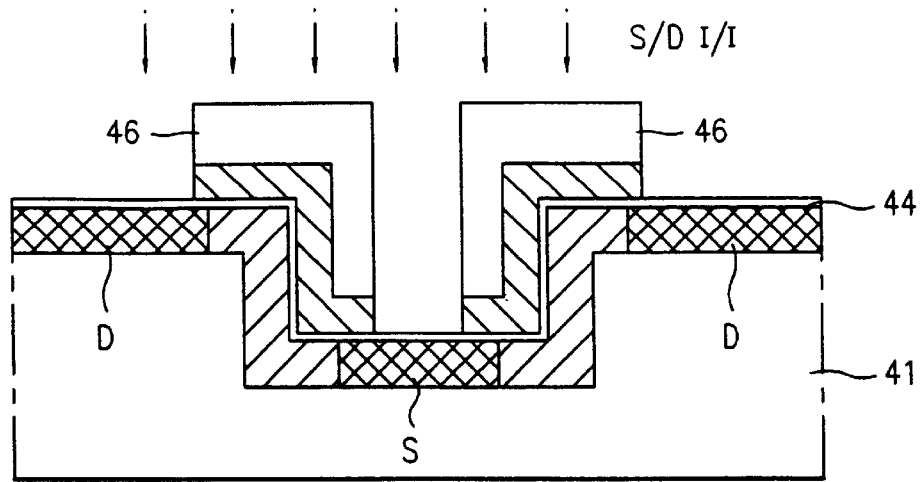
Figure 4E:
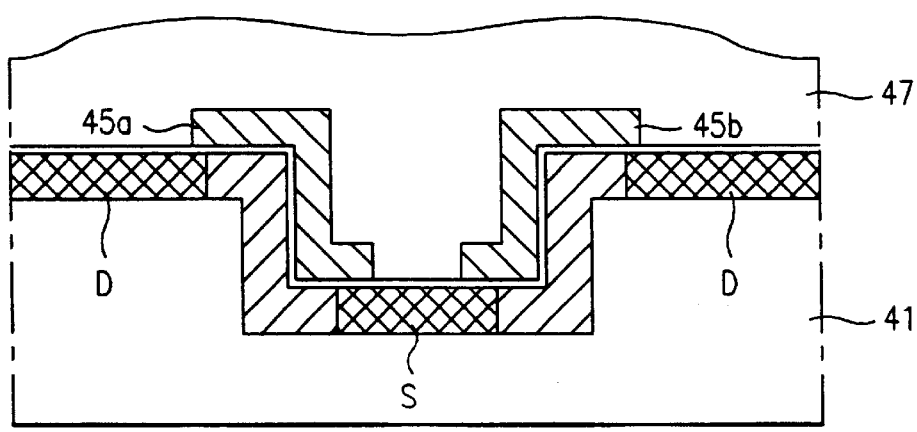

Referring to FIG. 4D, using the photoresist pattern 46 as a mask, the conductive layer 45 is selectively removed by an etch process to form first and second electrodes 45a and 45b as shown in FIG. 4E. The first and second gate electrodes 45a and 45b are separated at the center portion of the trench 42.

After the formation of the first and second gate electrodes 45a and 45b, impurity ions for source and drain electrodes are implanted. While the active layer 43 on the center portion of the trench, where the first and second gate electrodes 45a and 45b are separated, is a source electrode S, the active layer 43 corresponding to the substrate 41 at both sides of the source electrode S is drain electrodes D.

Referring to FIG. 4E, an insulating layer 47 is formed on the gate insulating film 44 including the first and second gate electrodes 45a and 45b. This insulating layer 47 is made of, for example, a silicon nitride film having a different selective etch ratio from that of the gate insulating film 44. In other words, if the gate insulating film 44 is a silicon nitride film, the insulating layer 47 is a silicon oxide film. Thus the gate insulating film 44 has a different selective etch rate from that of the insulating layer 47 so as to prevent the overetch of the drain electrode D under the gate insulating film 44.

Figure 4F:
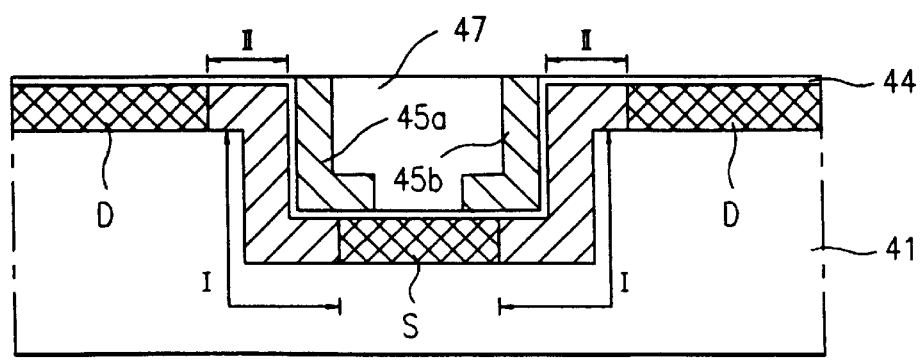

Referring to FIG. 4F, the insulating layer 47 is subjected to an etch-back to bury the trench 42. At this time, the insulating layer 47 is etched-back until the gate insulating film 44 is exposed. Since the insulating films 44 and 47 have different selective etch rates, the drain electrode D under the gate insulating film 44 is not damaged. The exposed gate electrodes 45a and 45b are etched-back to totally planarize the substrate.

Channel regions II are formed on both sides and a bottom side of the trench 42 and offset regions II are formed at right angle to the channel regions I. That is, the offset regions II are parallel with the drain electrode D. Till now, two gate electrodes per a trench are formed.

In another embodiment, only on one side of a trench, there is formed a gate electrode. Not shown in the drawing, a trench is formed in a substrate and then an active layer is formed on the entire surface. Thereafter, after forming a gate insulating film on the active layer, a conductive layer for gate electrode is formed on the entire surface. Next a photoresist film is coated on the conductive layer and then is patterned. Using the photoresist pattern as a mask, the conductive layer is etched to form a gate electrode on one side of the trench. The following process steps are performed in the same way as two gate electrodes per a trench are formed.

Such a TFT and a fabricating method thereof have the following advantages. Since a self-alignment method is applied to form a channel region and an offset region, the overall process is simplified. Further, since masks are not unnecessary, there is no modification of offset region, thereby accomplishing stable performance of SRAM cells.

It will be apparent to those skilled in the art that various modification and variations can be made in the TFT and the fabricating method thereof of the present invention without departing from the spirit or scope of the inventions. Thus, it is intended that the present invention cover the modifications and variations of this invention provided they come within the scope of the appended claims and their equivalents.

What is claimed is:

1. A thin film transistor (TFT) comprising:
   an insulating substrate;
   a trench formed in the insulating substrate;
   an active layer formed on the insulating substrate and on the trench;
   a gate insulating film formed on the active layer;
   a gate electrode formed on the gate insulating film on at least one side of the trench;
   a source region formed in the active layer on a bottom side of the trench, the source region being formed on the insulating substrate; and
   a drain region formed in the active layer on the substrate to be isolated from the gate electrode by a distance substantially greater than the thickness of the gate insulating film.

2. The TFT as claimed in claim 1, further comprising an offset region between the gate electrode and the drain region, wherein the offset region isolates the drain region from the gate electrode.

3. The TFT as claimed in claim 2, wherein the offset region is parallel to the drain region.

4. The TFT as claimed in claim 2, wherein a channel region is formed in the active region between the source region and the offset region.

5. The TFT as claimed in claim 4, wherein the channel region is perpendicular to the offset region.

6. The TFT as claimed in claim 1, further comprising an insulating film formed in the trench where the gate electrode is formed.

7. The TFT as claimed in claim 6, wherein the insulating film is made of a material having a different selective etch rate from that of the gate insulating film.

8. The TFT comprising:

a substrate;

a trench having first and second sides in the substrate;

an active layer on the substrate and on the trench;

a gate insulating film formed on the active layer;

first and second gate electrodes formed on the gate insulating film on the first and second sides of the trench, respectively;

a source region formed on a bottom side of the trench between the first and second gate electrodes; and first and second drain regions formed in the active layer over the substrate to be isolated from the first and second gate electrodes, respectively, by a predetermined distance substantially greater than the thickness of the gate insulating film.

9. The TFT as claimed in claim 8, further comprising first and second offset regions formed in the active layer between the drain regions and the first and second gate electrodes, respectively.

10. The TFT as claimed in claim 8, wherein the active layer and the first and second gate electrodes are planarized.

11. The TFT as claimed in claim 8, wherein the first and second gate electrodes partially overlap the source region.

* * * * *